United States Patent
Chung et al.

(10) Patent No.: US 8,637,373 B2
(45) Date of Patent: Jan. 28, 2014

(54) TRANSISTORS AND METHODS OF MANUFACTURING THE SAME

(75) Inventors: Hoi-Sung Chung, Hwaseong-si (KR);
 Dong-Suk Shin, Yongin-si (KR);
 Dong-Hyuk Kim, Seongnam-si (KR);
 Myung-Sun Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 148 days.

(21) Appl. No.: 13/410,475

(22) Filed: Mar. 2, 2012

(65) Prior Publication Data
US 2012/0223364 A1  Sep. 6, 2012

(30) Foreign Application Priority Data
Mar. 2, 2011  (KR) .................. 10-2011-0018343

(51) Int. Cl.
 *H01L 21/336*  (2006.01)
(52) U.S. Cl.
 USPC .......... 438/285; 438/222; 438/493; 438/494; 438/590; 257/192; 257/E21.409
(58) Field of Classification Search
 USPC .......... 438/222, 226, 285, 590; 257/192, 288, 257/347
 See application file for complete search history.

(56) References Cited

U.S. PATENT DOCUMENTS

| 7,989,901 B2 * | 8/2011 | Lin et al. ............. 257/408 |
| 2008/0303060 A1 | 12/2008 | Han et al. |
| 2009/0140302 A1 | 6/2009 | Onoda |
| 2010/0230721 A1 | 9/2010 | Yasutake |
| 2010/0301394 A1 * | 12/2010 | Shimamune et al. ...... 257/192 |
| 2012/0181625 A1 * | 7/2012 | Kwok et al. ............ 257/408 |
| 2013/0207166 A1 * | 8/2013 | Chen et al. ............ 257/288 |

FOREIGN PATENT DOCUMENTS

JP  2009-099702  5/2009

* cited by examiner

*Primary Examiner* — Angel Roman
(74) *Attorney, Agent, or Firm* — F. Chau & Associates, LLC

(57) ABSTRACT

In a method of manufacturing a transistor, a gate structure is formed on a substrate including silicon. An upper portion of the substrate adjacent to the gate structure is etched to form a first recess in the substrate. A preliminary first epitaxial layer including silicon-germanium is formed in the first recess. An upper portion of the preliminary first epitaxial layer is etched to form a second recess on the preliminary first epitaxial layer. In addition, a portion of the preliminary first epitaxial layer adjacent to the second recess is etched to thereby transform the preliminary first epitaxial layer into a first epitaxial layer. A second epitaxial layer including silicon-germanium is formed in the second recess located on the first epitaxial layer.

20 Claims, 11 Drawing Sheets

TRANSISTORS AND METHODS OF MANUFACTURING THE SAME

CROSS-REFERENCE TO RELATED APPLICATIONS

This application claims priority under 35 USC §119 to Korean Patent Application No. 10-2011-0018343, filed on Mar. 2, 2011, the disclosure of which is hereby incorporated by reference herein in its entirety.

TECHNICAL FIELD

Example embodiments relate to transistors and methods of manufacturing the same. More particularly, example embodiments relate to PMOS transistors including an epitaxial layer and methods of manufacturing the same.

DESCRIPTION OF THE RELATED ART

To increase the operational current characteristics and the operational speed of a transistor, a study of increasing the mobility of electrons or holes of the transistor by applying a tensile stress or a compressive stress to a channel region of the transistor has been introduced. For example, an epitaxial layer including silicon-germanium of which a lattice parameter is greater than that of a silicon substrate may be grown in source and drain regions of a p-channel metal oxide semiconductor (PMOS) transistor, so that a compressive stress may be applied to a channel region between the source and drain regions.

Thus, a method of growing an epitaxial layer in source and drain regions may be required to apply sufficient stress to a channel region.

SUMMARY

Example embodiments provide a transistor including an epitaxial layer for applying a sufficient compressive stress to a channel region of the transistor.

Example embodiments provide a method of manufacturing a transistor including an epitaxial layer for applying a sufficient compressive stress to a channel region of the transistor.

According to an example embodiment, there is provided a method of manufacturing a transistor. In the method, a gate structure is formed on a substrate including silicon. An upper portion of the substrate adjacent to the gate structure is etched to form a first recess in the substrate. A preliminary first epitaxial layer including silicon-germanium is formed in the first recess. An upper portion of the preliminary first epitaxial layer is etched to form a second recess on the preliminary first epitaxial layer. In addition, a portion of the preliminary first epitaxial layer adjacent to the second recess is etched to thereby transform the preliminary first epitaxial layer into a first epitaxial layer. A second epitaxial layer including silicon-germanium is formed in the second recess located on the first epitaxial layer.

In an example embodiment, both of the first and second recesses may include at least one facet substantially parallel to the (111) crystal plane of silicon.

In an example embodiment, the second epitaxial layer may have a germanium concentration substantially higher than a germanium concentration of the first epitaxial layer.

In an example embodiment, when the first recess is formed, a first spacer may be formed on a sidewall of the gate structure, a first dry etching process may be performed at an upper portion of the substrate adjacent to the gate structure using the gate structure and the first spacer as an etching mask to form the first recess, and a first wet etching process may be performed at an upper portion of the substrate adjacent to the first recess to enlarge the first recess.

In an example embodiment, the first dry etching process may have isotropic etching characteristics.

In an example embodiment, the first wet etching process may be performed using an etchant having an etching selectivity according to the crystal plane of silicon.

In an example embodiment, the etchant may include NH$_4$OH, tetramethyl ammonium hydroxide (TMAH), potassium hydroxide (KOH), sodium hydroxide (NaOH) and/or benzyltrimethylammonium hydroxide (BTMH).

In an example embodiment, when the second recess is formed, a second spacer may be formed on the first spacer, a second dry etching process may be performed at an upper portion of the preliminary first epitaxial layer adjacent to the gate structure using the gate structure and the first and second spacers as an etching mask to form the second recess, and a second wet etching process may be performed at a portion of the preliminary first epitaxial layer adjacent to the second recess to enlarge the second recess and to transform the preliminary first epitaxial layer into the first epitaxial layer.

In an example embodiment, the second dry etching process may have isotropic etching characteristics, and the second wet etching process may be performed using an etchant having an etching selectivity according to the crystal plane of silicon.

In an example embodiment, an upper portion of the second epitaxial layer may be further etched to form a third recess in the second epitaxial layer, and a third epitaxial layer including silicon-germanium may be formed in the third recess. The third epitaxial layer may have a germanium concentration substantially higher than a germanium concentration of each of the first and second epitaxial layers.

In an example embodiment, when the third recess is formed, a third spacer may be formed on a sidewall of the gate structure, a third dry etching process may be performed at an upper portion of the second epitaxial layer adjacent to the gate structure to form the third recess, and a fourth dry etching process may be performed at a portion of the second epitaxial layer adjacent to the third recess to enlarge the third recess.

In example embodiments, the third dry etching process may have isotropic etching characteristics, and the fourth dry etching process may be performed under an atmosphere including hydrogen chloride (HCl) gas.

According to an example embodiment, there is provided a transistor. The transistor includes a gate structure, a first epitaxial layer and a second epitaxial layer. The gate structure is on a silicon substrate having a first recess formed therein. The gate structure is adjacent to the first recess. The first epitaxial layer is on an inner wall of the first recess. The first epitaxial layer includes silicon-germanium and the first recess includes at least one (111) facet substantially parallel to the (111) crystal plane. In addition, the first epitaxial layer includes a second recess foamed thereon. The second epitaxial layer is formed in the second recess located on the first epitaxial layer. The second epitaxial layer includes silicon-germanium and the second recess includes at least one (111) facet substantially parallel to the (111) crystal plane.

In an example embodiment, the second epitaxial layer may have a germanium concentration substantially higher than a germanium concentration of the first epitaxial layer.

In an example embodiment, wherein the first epitaxial layer may have a germanium concentration of about 5 to about 30 wt %, and the second epitaxial layer may have a germanium concentration of about 10 to about 60 wt %.

In an example embodiment, a method for manufacturing a complementary metal oxide semiconductor (CMOS) is provided. The method includes forming a gate insulation layer, a gate conductive layer and a gate mask layer on a substrate composed of silicon and including an NMOS region and a PMOS region, patterning the gate insulation layer, the gate conductive layer and the gate mask layer to form a first gate structure including, a first gate insulation layer pattern, a first gate electrode and a first gate mask sequentially stacked on the substrate in the NMOS region, and a second gate structure including a second insulation layer pattern, a second gate electrode and a second gate mask sequentially stacked on the substrate in the PMOS region, foaming a first spacer layer on the substrate to cover the first gate structure and the second gate structure, etching the first spacer layer to form a first spacer covering a sidewall of the second gate structure on the substrate in the PMOS region, performing a first dry etching process at an upper portion of the substrate adjacent to the second gate structure to form a first recess in the substrate in the PMOS region, performing a first wet etching process at a portion of the substrate adjacent to the first recess to enlarge the first recess, and forming a preliminary first epitaxial layer including silicon-germanium in the first recess.

The method further includes forming a second spacer layer on the first spacer layer in the NMOS region and on the second gate structure and the preliminary first epitaxial layer on the substrate in PMOS region, etching the second spacer layer to form a second spacer on the first spacer and the preliminary first epitaxial layer, performing a second dry etching process on an upper portion of the preliminary first epitaxial layer using the second gate structure and the first and second spacers formed on a sidewall of the second gate structure as an etching mask to form a second recess on the preliminary first epitaxial layer, performing a second wet etching process at an upper portion of the preliminary first epitaxial layer adjacent to the second recess to enlarge the second recess and to transform the preliminary first epitaxial layer into a first epitaxial layer. The first epitaxial layer has a substantially uniform thickness on a bottom portion and sidewall portions of the first recess, and a germanium concentration of the second epitxial layer is greater than a germanium concentration of the first epitaxial layer.

Moreover, the method further includes forming a second epitaxial layer including silicon-germanium in the second recess located on the first epitaxial layer, etching the first and second spacer layers in the NMOS region to form a third spacer on a sidewall of the first gate structure on the substrate in the NMOS region and implanting impurities at a portion of substrate in the NMOS region to form a first impurity region therein and at a portion of the substrate in the PMOS region to form a second impurity region therein.

BRIEF DESCRIPTION OF THE DRAWINGS

Example embodiments can be understood in more detail from the following detailed description taken in conjunction with the accompanying drawings.

FIG. 1 is a cross-sectional view illustrating a transistor in accordance with an example embodiment;

FIGS. 2 to 8 are cross-sectional views illustrating a method of manufacturing a transistor in accordance with an example embodiment;

FIG. 9 is a cross-sectional view illustrating a transistor in accordance with an example embodiment;

FIGS. 10 to 11 are cross-sectional views illustrating a method of manufacturing a transistor in accordance with an example embodiment;

FIG. 12 is a cross-sectional view illustrating a transistor in accordance with an example embodiment;

FIGS. 13 to 19 are cross-sectional views illustrating a method of manufacturing a transistor in accordance with an example embodiment; and FIG. 20 is a cross-sectional view illustrating a method of manufacturing a transistor in accordance with a comparative embodiment.

DESCRIPTION OF EXAMPLE EMBODIMENTS

Figure 1:
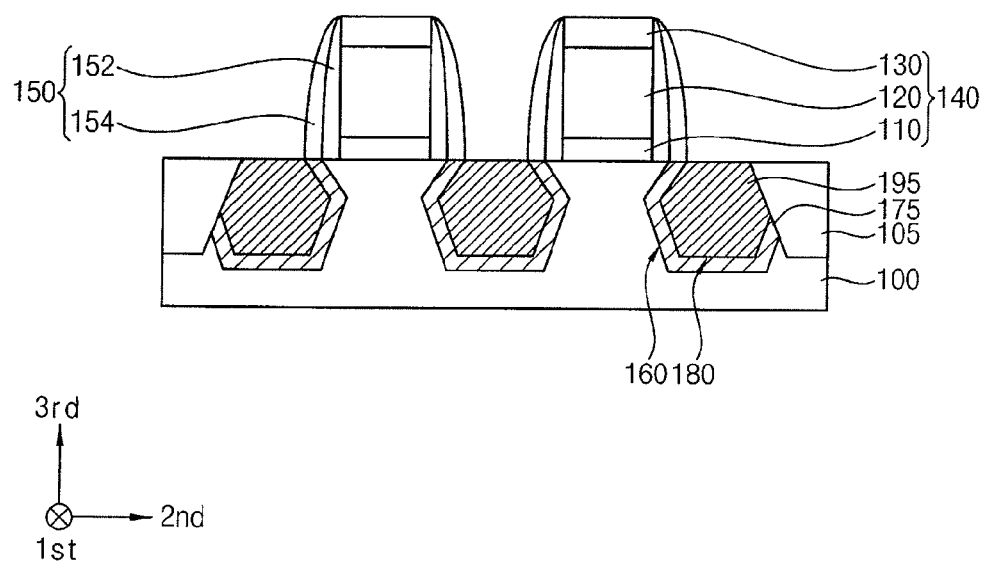
FIGS. 1 to 20 represent non-limiting, example embodiments as described herein.

Various example embodiments will be described more fully hereinafter with reference to the accompanying drawings, in which example embodiments are shown. The present inventive concept may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

As used herein, the singular forms "a," "an" and "the" are intended to include the plural forms as well, unless the context clearly indicates otherwise.

FIG. 1 is a cross-sectional view illustrating a transistor in accordance with an example embodiment.

Referring to FIG. 1, the transistor may include, for example, a gate structure 140 and a spacer structure 150 on a substrate 100, a first epitaxial layer 175 and a second epitaxial layer 195 at an upper portion of the substrate 100 adjacent to the gate structure 140.

In an example embodiment, the substrate 100 may be, for example, a silicon substrate. A top surface of the substrate 100 may be, for example, substantially parallel to the (001) crystal plane. An isolation layer 105 may be formed on the substrate 100 to define an active region and a field region.

The gate structure 140 may include, for example, a gate insulation layer pattern 110, a gate electrode 120 and a gate mask 130 sequentially stacked on the substrate 100. For example, in an example embodiment, a plurality of gate structures 140, each of which may extend in a first direction substantially parallel to the top surface of the substrate 100, may be arranged in a second direction substantially perpendicular to the first direction.

The spacer structure 150 may be formed on a sidewall of the gate structure 140. The spacer structure 150 may include, for example, a first spacer 152 and a second spacer 154 sequentially stacked on the sidewall of the gate structure 140. The spacer structure 150 may include, for example, silicon oxide, silicon nitride and/or silicon oxynitride.

The first epitaxial layer 175 may be formed on an inner wall of a first recess 160 at an upper portion of the substrate 100 adjacent to the gate structure 140 and partially fill the first recess 160. A top surface of the first epitaxial layer 175 may be, for example, coplanar with the top surface of the substrate 100.

The first recess 160 may include, for example, at least one (111) facet substantially parallel to the (111) crystal plane.

The (111) facet may be, for example, a plane having an angle of about 54.7° with respect to the top surface of the substrate 100. In an example embodiment, a bottom face of the first recess 160 may be, for example, substantially parallel to the (001) crystal plane, and a sidewall of the first recess 160 may be substantially parallel to the (111) crystal plane. For example, in an example embodiment, a (111) facet on an upper sidewall of the first recess 160 may have a direction different from that of a (111) facet on a lower sidewall of the first recess 160, so that an upper portion of the first recess 160 may have a width smaller than that of a central portion of the first recess 160.

In an example embodiment, the first epitaxial layer 175 may have, for example, a thickness relatively uniform on the bottom face and the sidewall of the first recess 160. The first epitaxial layer 175 may have a thickness with respect to the [111] direction, e.g., with respect to the direction substantially perpendicular to the (111) crystal plane, which is substantially the same or similar to a thickness with respect to the [001] crystal direction, e.g., the direction substantially perpendicular to the (001) crystal plane. For example, a thickness of the first epitaxial layer 175 with respect to the [111] direction may be about 0.5 to about 1.0 times of a thickness with respect to the [001] direction.

The first epitaxial layer 175 may include, for example, silicon-germanium. In an example embodiment, the first epitaxial layer 175 may have, for example, a first germanium concentration of about 5 to about 30 wt %. If the germanium concentration of the first epitaxial layer 175 is less than the first germanium concentration, a compressive stress applied to a channel region may be insufficient. If the germanium concentration of the first epitaxial layer 175 is greater than the first germanium concentration, a lattice mismatch between the first epitaxial layer 175 and the substrate 100 including silicon may occur so that a compressive stress applied to a channel region may be decreased.

The second epitaxial layer 195 may fill a second recess 180, which may be defined by an upper face of the first epitaxial layer 175. The second epitaxial layer 195 may have, for example, a top surface coplanar with that of the substrate 100.

The second recess 180 may have, for example, at least one (111) facet corresponding to that of the first recess 160. In an example embodiment, a bottom face of the second recess 180 may be, for example, substantially parallel to the (001) crystal plane, and a sidewall of the second recess 180 may be, for example, substantially parallel to the (111) crystal planes. In an example embodiment, a (111) facet on an upper sidewall of the second recess 180 may have, for example, a direction different from that of a (111) facet on a lower sidewall of the second recess 180, so that an upper portion of the second recess 180 may have a width substantially smaller than that of a central portion of the second recess 180.

The second epitaxial layer 195 may include, for example, silicon-germanium. In an example embodiment, the second epitaxial layer 195 may have a second germanium concentration of, for example, about 10 to about 60 wt %. The second germanium concentration of the second epitaxial layer 195 may be, for example, greater than the first germanium concentration of the first epitaxial layer 175.

In an example embodiment, portions of the first and second epitaxial layers 175 and 195 may be doped with impurities, such that the doped first and second epitaxial layers 175 and 195 may serve as source/drain regions of the transistor. In an example embodiment, the impurities may include, for example, p-type impurities such as boron, and the transistor may be a PMOS transistor.

In an example embodiment, upper portions of the substrate 100 together with the first and second epitaxial layers 175 and 195 may be doped with impurities, such that doped upper portions of the substrate 100 and the doped first and second epitaxial layers 175 and 195 may serve as source/drain regions of the transistor.

According to an example embodiment, the transistor may include, for example, the first epitaxial layer 175 and the second epitaxial layer 195 including silicon-germanium sequentially stacked on sidewalls of the channel region at an upper portion of the substrate 100. The first epitaxial layer 175 may have, for example, at least one (111) facet, and the second epitaxial layer 195 may have, for example, also at least one (111) facet corresponding to that of the first epitaxial layer 175. A bottom portion of the first epitaxial layer 175 may have, for example, a thickness similar to that of a lateral portion thereof, so that the second epitaxial layer 195 may have a maximum volume in a space defined by the first epitaxial layer 175. The first and second epitaxial layers 175 and 195 may include, for example, silicon-germanium of which a lattice parameter is larger than that of silicon, and the second germanium concentration of the second epitaxial layer 195 may be higher than the first germanium concentration of the first epitaxial layer 175. Thus, a sufficient compressive stress may be applied to the channel region, and the transistor including the channel region may have increased electrical characteristics.

FIGS. 2 to 8 are cross-sectional views illustrating a method of manufacturing a transistor in accordance with an example embodiment.

Figure 2:
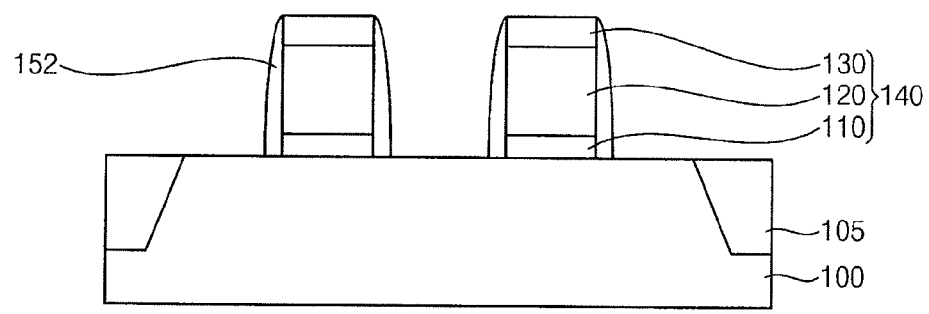

Referring to FIG. 2, a gate structure 140 and a first spacer 152 may be formed on a substrate 100 having an isolation layer 105 thereon.

The substrate 100 may be, for example, a semiconductor substrate such as a silicon substrate. A top surface of the substrate 100 may be, for example, substantially parallel to the (001) crystal plane.

The isolation layer 105 may be formed by, for example, a shallow trench isolation (STI) process. A region of the substrate 100 in which the isolation layer 105 is not formed may be defined as an active region, and a region of the substrate 100 in which the isolation layer 105 is formed may be defined as a field region.

A gate insulation layer, a gate conductive layer and a gate mask layer may be sequentially formed on the substrate 100. The gate mask layer, the gate conductive layer and the gate insulation layer may be sequentially patterned to form the gate structure 140 including a gate insulation layer pattern 110, a gate electrode 120 and a gate mask 130 sequentially stacked on the substrate 100. In an example embodiment, a plurality of gate structures 140, each of which may extend, for example, in a first direction, may be arranged in a second direction substantially perpendicular to the first direction.

A first spacer 152 may be further formed on a sidewall of the gate structure 140. A first spacer layer may be formed on the substrate 100 to cover the gate structure 140, and the first spacer layer may be anisotropically etched to form the first spacer 152. The first spacer 152 may be formed using, for example, silicon oxide, silicon nitride or silicon oxynitride.

Figure 3:
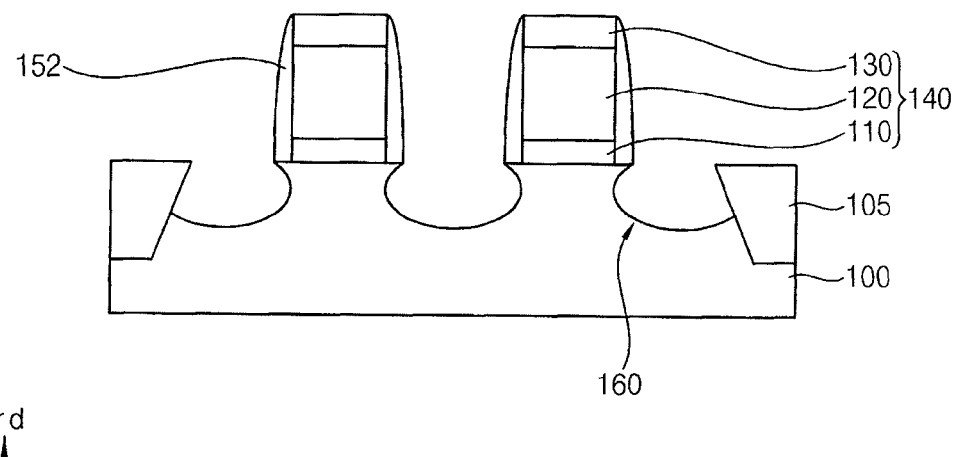

Referring to FIG. 3, a first recess 160 may be formed at an upper portion of the substrate 100 adjacent to the gate structure 140.

For example, a first dry etching process may be performed on an upper portion of the substrate 100 adjacent to the gate structure 140 using the gate structure 140 and the first spacer 152 as an etching mask to form the first recess 160. The first dry etching process may have, for example, isotropic etching characteristics so that the first recess 160 may be formed to have, e.g., a bullet shape. An upper portion of the first recess 160 may have, for example, a width smaller than a width of a central portion of the first recess 160. A width of the upper portion of the first recess 160 may be controlled by varying a thickness of the first spacer 152.

Figure 4:
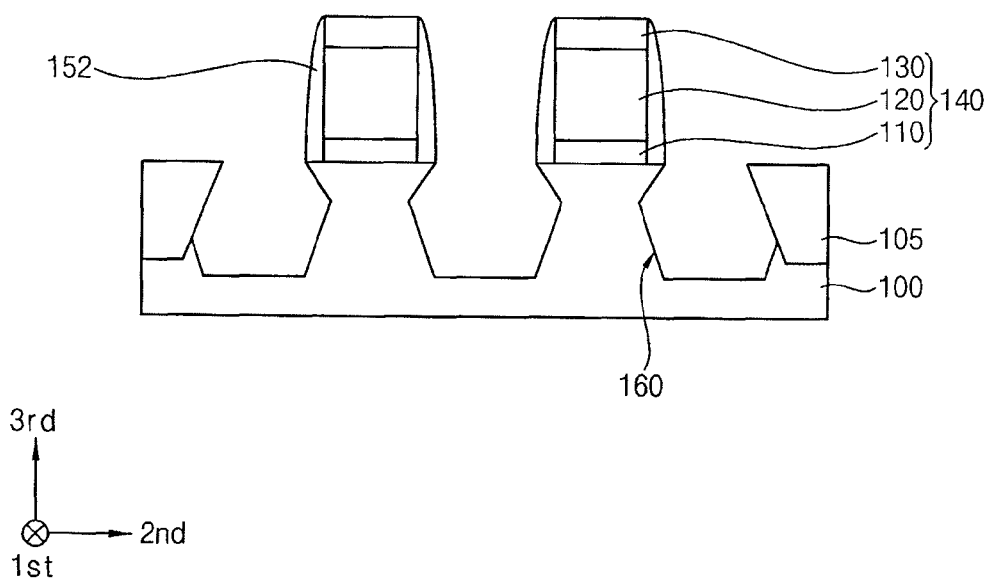

Referring to FIG. 4, a first wet etching process may be performed at a portion of the substrate 100 adjacent to the first recess 160 to enlarge the first recess 160.

The first wet etching process may be performed using, for example, an etchant having an etching selectivity according to the crystal plane of silicon. In an example embodiment, the first wet etching process may be performed using, for example, ammonium hydroxide (NH$_4$OH), tetramethyl ammonium hydroxide (TMAH), potassium hydroxide (KOH), sodium hydroxide (NaOH) or benzyltrimethylammonium hydroxide (BTMH) as an etchant.

When the etchant is used, an etching rate with respect to the (001) crystal plane may be higher than an etching rate with respect to the (111) crystal plane because the (001) crystal plane of silicon may have a packing density lower than that of the (111) crystal plane of silicon. The top surface of the substrate 100 may be substantially parallel to the (001) crystal plane, and thus an etching rate in a third direction substantially perpendicular to the top surface of the substrate 100 may be relatively high. An etching rate with respect to the (111) crystal plane may be relatively low so that the first recess 160 may have a (111) facet substantially parallel to the (111) crystal plane. The first recess 160 may have, for example, at least one (111) facet, and a bottom portion of the first recess 160 may be, for example, substantially parallel to the (001) crystal plane. The (111) facet may have, for example, an angle of about 54.7° with respect to the top surface of the substrate 100.

For example, in an example embodiment, an upper sidewall of the first recess 160 may have a first (111) facet, and a lower sidewall of the first recess 160 may have a second (111) facet of which the direction of is different from that of the first (111) facet. The first recess 160 may have, for example, a width at a central portion larger than at an upper portion of the first recess 160. The first recess 160 may have, for example, the largest width at a boundary between the first (111) facet and the second (111) facet.

Figure 5:
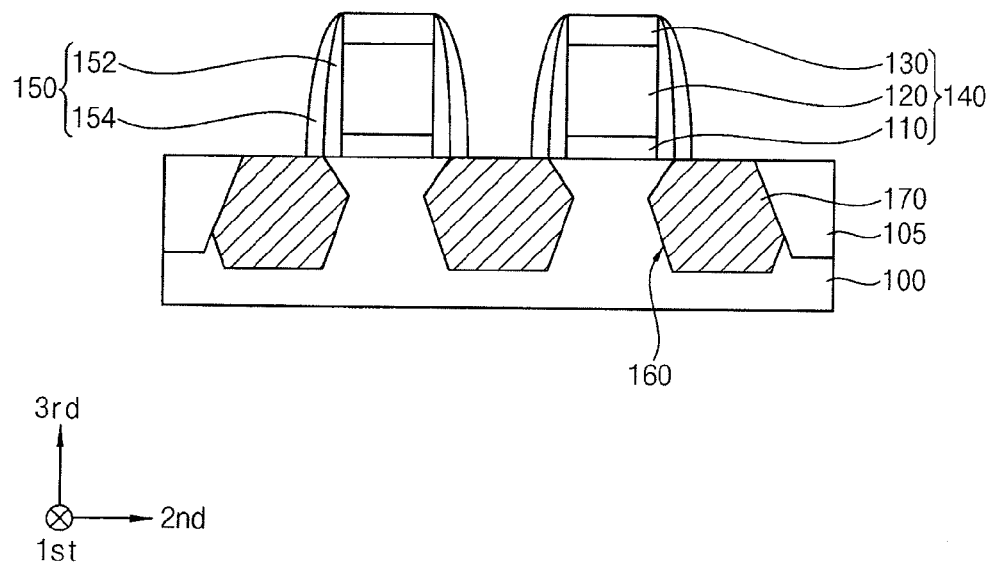

Referring to FIG. 5, a preliminary first epitaxial layer 170 including, for example, silicon-germanium may be formed in the first recess 160, and a second spacer 154 may be formed on the first spacer 152 and the preliminary first epitaxial layer 170.

The preliminary first epitaxial layer 170 may be formed by, for example, a selective epitaxial growth (SEG) process on the inner wall of the first recess 160. The SEG process may be performed using, for example, a silicon-germanium source gas by a chemical vapor deposition (CVD) process, a low pressure chemical vapor deposition (LPCVD) process or an ultra high vacuum CVD (UHV-CVD) process. In an example embodiment, the preliminary first epitaxial layer 170 may include, for example, silicon-germanium having a first germanium concentration of about 5 to about 30 wt %. If the germanium concentration of the preliminary first epitaxial layer 170 is less than the first germanium concentration, a compressive stress applied to a channel region may be insufficient. If the germanium concentration of the preliminary first epitaxial layer 170 is greater than the first germanium concentration, a lattice mismatch between the preliminary first epitaxial layer 170 and the substrate 100 including silicon may occur so that a compressive stress applied to a channel region may be decreased. In an example embodiment, the preliminary first epitaxial layer 170 may have, for example, a top surface coplanar with the top surface of the substrate 100.

A second spacer layer (not shown) may be formed on the gate structure 140, the first spacer 152 and the preliminary first epitaxial layer 170, and the second spacer layer may be anisotropically etched to form a second spacer 154 on the first spacer 152 and the preliminary first epitaxial layer 170. In an example embodiment, the second spacer 154 may be formed using, for example, silicon oxide, silicon nitride or silicon oxynitride. The second spacer 154 and the first spacer 152 may be defined as a spacer structure 150.

Figure 6:
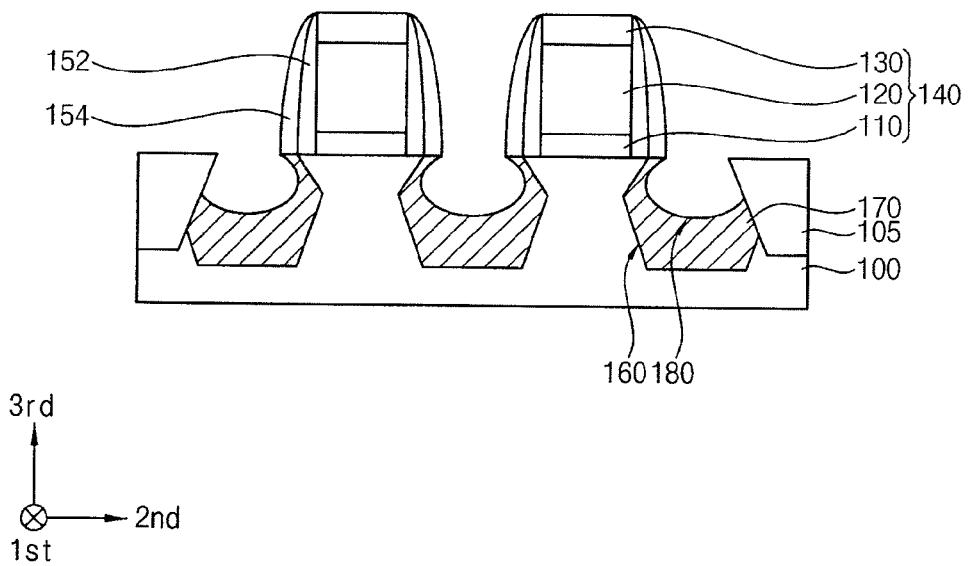

Referring to FIG. 6, a second recess 180 may be formed on the preliminary first epitaxial layer 170.

For example, a second dry etching process may be performed at an upper portion of the preliminary first epitaxial layer 170 using the gate structure 140 and the first and second spacers 152 and 154 as an etching mask to form the second recess 180. The second dry etching process may have, for example, isotropic etching characteristics so that the second recess 180 may be formed to have, e.g., a bullet shape. A width of the second recess 180 may be controlled by thicknesses of the first and second spacers 152 and 154. The second recess 180 may have, for example, a width smaller than that of the first recess 160 because the second spacer 154 may be formed on the first spacer 152. An upper portion of the preliminary first epitaxial layer 170 on which the second spacer 154 is not formed may not be etched.

Figure 7:
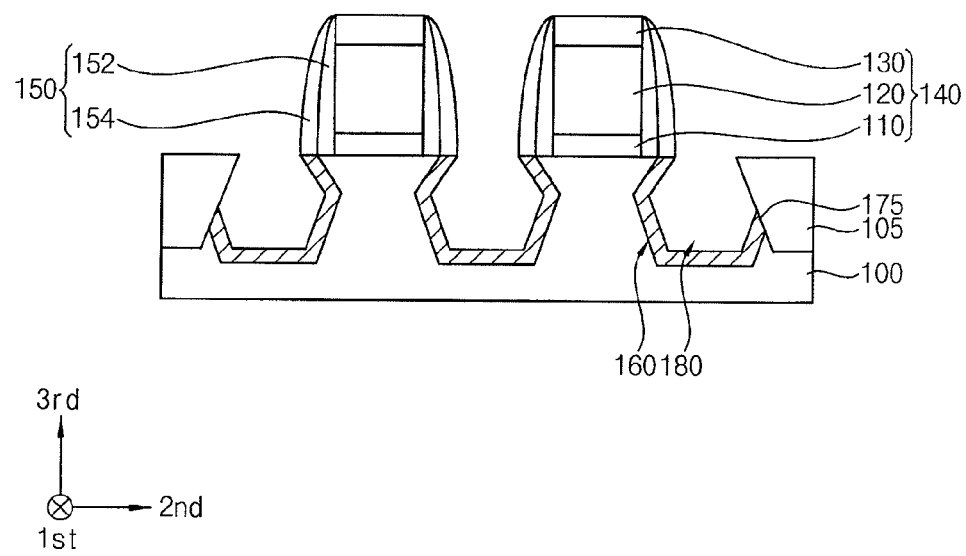

Referring to FIG. 7, a second wet etching process may be performed on the preliminary first epitaxial layer 170 adjacent to the second recess 180 to enlarge the second recess 180 and transform the preliminary first epitaxial layer 170 into a first epitaxial layer 175.

The second wet etching process may be performed using, for example, an etchant having an etching selectivity according to the crystal plane of silicon. In an example embodiment, the second wet etching process may be performed using, for example, NH$_4$OH, tetramethyl ammonium hydroxide (TMAH), KOH, NaOH or benzyltrimethylammonium hydroxide (BTMH) as an etchant.

When the etchant is used, an etching rate with respect to the (001) crystal plane may be higher than an etching rate with respect to the (111) crystal plane because the (001) crystal plane of silicon may have a packing density lower than that of the (111) crystal plane of silicon. The top surface of the substrate 100 may be, for example, substantially parallel to the (001) crystal plane, and thus an etching rate in a third direction substantially perpendicular to the top surface of the substrate 100 may be relatively high. An etching rate with respect to the (111) crystal plane may be relatively low so that the second recess 180 may have, for example, a (111) facet substantially parallel to the (111) crystal plane. The second recess 180 may have, for example, at least one (111) facet, and a bottom portion of the second recess 180 may be substantially parallel to the (001) crystal plane.

In an example embodiment, the second recess 180 may be formed to have, for example, a shape similar to that of the first recess 160. That is, an upper sidewall of the second recess 180 may have a first (111) facet, and a lower sidewall of the second recess 180 may have a second (111) facet of which the direction of is different from that of the first (111) facet. The second recess 180 may have, for example, a width at a central portion larger than at an upper portion thereof.

The first epitaxial layer 175 may include, for example, silicon-germanium having a first germanium concentration. The first epitaxial layer 175 may have, for example, a thickness on a bottom portion of the first recess 160 similar to that on a sidewall of the first recess 160. For example, a thickness of the first epitaxial layer 175 on the bottom portions of the first recess 160 may be about 0.5 to about 1.0 times of a thickness of the first epitaxial layer 175 on the sidewall of the first recess 160. In an example embodiment, the first epitaxial layer 175 may have a thickness of, for example, about 5 nm to about 20 nm on the bottom portion of the first recess 160 and a thickness of, for example, about 2.5 nm to about 20 nm on the sidewall thereof.

Figure 8:
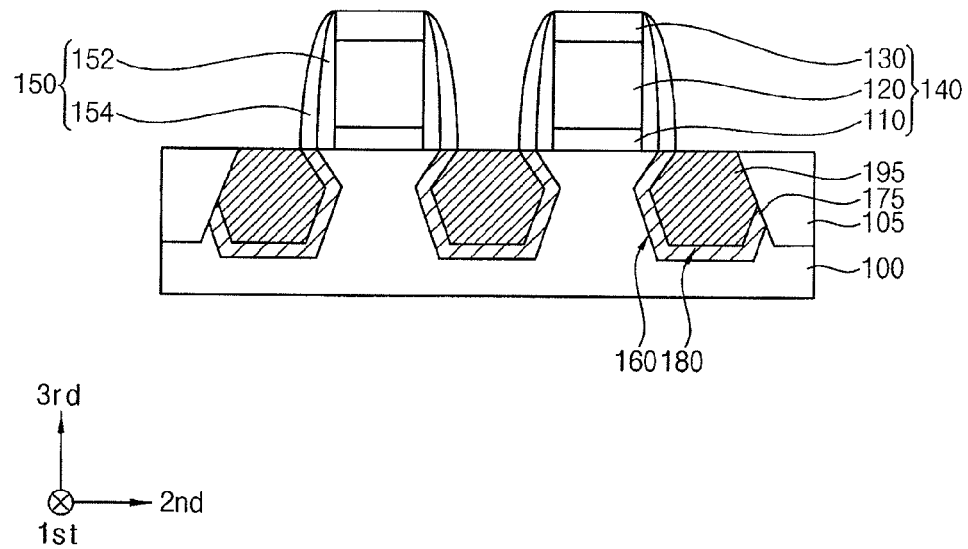

Referring to FIG. 8, a second epitaxial layer 195 including, for example, silicon-germanium may be formed in the second recess 180.

The second epitaxial layer 195 may be formed by a selective epitaxial growth (SEG) process on an inner wall of the second recess 180. The SEG process may be performed using, for example, a silicon-germanium source gas by a CVD process, an LPCVD process or a UHV-CVD process.

In an example embodiment, the second epitaxial layer 195 may have, for example, a second germanium concentration of about 10 to about 60 wt %. If the germanium concentration of the second epitaxial layer 195 is less than the second germanium concentration, a compressive stress applied to a channel region may be insufficient. If the germanium concentration of the second epitaxial layer 195 is greater than the second germanium concentration, a lattice mismatch between the second epitaxial layer 195 and the first epitaxial layer 175 may occur so that a compressive stress applied to a channel region may be decreased.

In an example embodiment, the second epitaxial layer 195 may have, for example, a top surface coplanar with the top surface of the substrate 100. In an example embodiment, the second epitaxial layer 195 may alternatively have, for example, a top surface higher than the top surface of the substrate 100.

An impurity region (not shown) may be formed at an upper portion of the substrate 100 adjacent to the gate structure 140 by, for example, an ion implantation process using the gate structure 140 and the spacer structure 150 as an ion implantation mask. The impurity region may include, for example, p-type impurities such as boron, and may serve as source/drain regions of the transistor.

In an example embodiment, the impurity region may be formed at some portions of or in the entire portion of the first and second epitaxial layers 175 and 195. In an example embodiment, the impurity region may alternatively be formed at upper portions of the substrate 100 together with the first and second epitaxial layers 175 and 195.

Thus, the transistor may be manufactured.

According to an example embodiment, the first dry etching process and the first wet etching process may be performed on the upper portion of the substrate 100 adjacent to the gate structure 140 to form the first recess having at least one (111) facet. The preliminary first epitaxial layer 170 including silicon-germanium may be formed in the first recess 160, and subsequently, the second dry etching process and the second wet etching process may be performed on the preliminary first epitaxial layer 170 to form the second recess 180 having at least one (111) facet corresponding to that of the first recess 160 and a first epitaxial layer 175 in the first recess 160. Thus, the first epitaxial layer 175 may have a uniform thickness on bottom and sidewall portions of the first recess 160, and the second epitaxial layer 195 including silicon-germanium may be formed on the first epitaxial layer 175.

The second epitaxial layer 195 may have largest maximum volume in a space defined by the upper face of the first epitaxial layer 175 and may have the second germanium concentration larger than the first germanium concentration of the first epitaxial layer 175. Thus, a sufficient compressive stress may be applied to the channel region, and the transistor including the channel region may have increased electrical characteristics.

Figure 9:
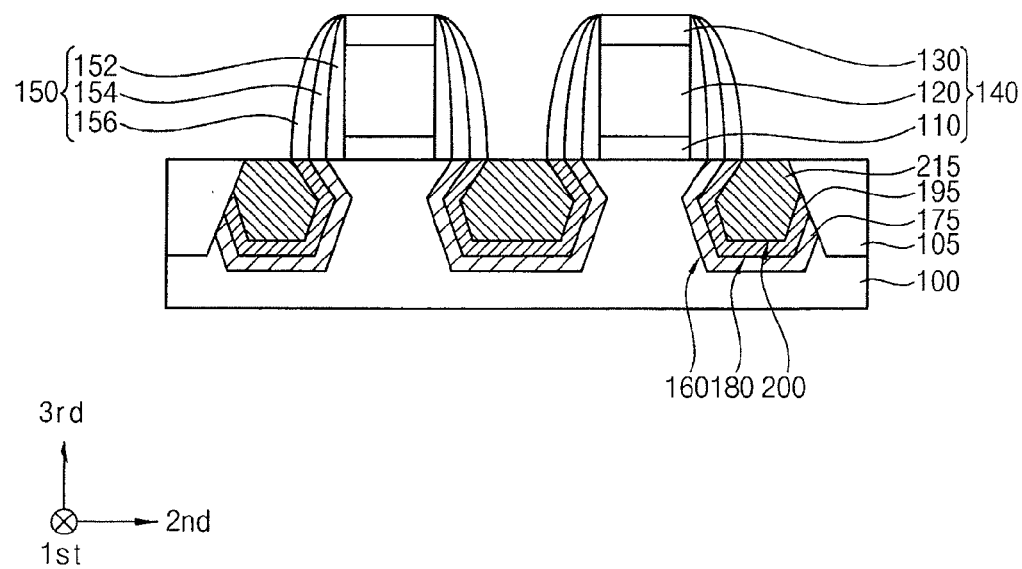

FIG. 9 is a cross-sectional view illustrating a transistor in accordance with an example embodiment. The transistor may have a structure substantially the same as or similar to that illustrated with reference to FIG. 1, except that a third recess and a third epitaxial layer are further formed.

Referring to FIG. 9, the transistor may include, for example, a gate structure 140 and a spacer structure 150 on a substrate 100, a first epitaxial layer 175, a second epitaxial layer 195 and a third epitaxial layer 215 at an upper portion of the substrate 100 adjacent to the gate structure 140.

The gate structure 140 may include, for example, a gate insulation layer pattern 110, a gate electrode 120 and a gate mask 130 sequentially stacked on the substrate 100 having an isolation layer 105 thereon. The spacer structure 150 may include, for example, a first spacer 152, a second spacer 154 and a third spacer 156 sequentially stacked on a sidewall of the gate structure 140.

The first epitaxial layer 175 may be formed on a bottom face and a sidewall of a first recess 160 formed at an upper portion of the substrate 100 adjacent to the gate structure 140 and partially fill the first recess 160. A top surface of the first epitaxial layer 175 may be, for example, coplanar with a top surface of the substrate 100. The first recess 160 may have, for example, at least one (111) facet. The first epitaxial layer 175 may include, for example, silicon-germanium having a first germanium concentration.

The second epitaxial layer 195 may partially fill a second recess 180 defined by an upper face of the first epitaxial layer 175. A top surface of the second epitaxial layer 195 may be, for example, coplanar with the top surface of the substrate 100. The second recess 180 may have, for example, at least one (111) facet. The second epitaxial layer 195 may include, for example, silicon-germanium having a second germanium concentration. The second germanium concentration of the second epitaxial layer 195 may be, for example, higher than the first germanium concentration of the first epitaxial layer 175.

The third epitaxial layer 215 may fill a third recess 200 provided in an upper face of the second epitaxial layers 195. The third recess 200 may include, for example, at least one (111) facet. The third epitaxial layer 215 may include, for example, silicon-germanium having a third germanium concentration. The third germanium concentration of the third epitaxial layer 215 may be, for example, higher than the second germanium concentration of the second epitaxial layer 195.

In an example embodiment, portions of the first to third epitaxial layers 175, 195 and 215 may be doped with impurities, such that the doped first to third epitaxial layers 175, 195, 215 may serve as source/drain regions of the transistor. The impurities may include, for example, p-type impurities such as boron, and the transistor may be a PMOS transistor.

According to an example embodiment, the transistor may have the first to third epitaxial layers 175, 195 and 215 sequentially formed on sidewalls of the channel region at an upper portion of the substrate 100. The first epitaxial layer 175 may have, for example, at least one (111) facet, and the second epitaxial layer 195 may have, for example, at least one (111) facet corresponding to that of the first epitaxial layer 175. The third epitaxial layer 215 may have, for example, at least one (111) facet corresponding to that of the second epitaxial layer 195. Thus, the first and second epitaxial layers 175 and 195 may have, for example, similar thicknesses on bottom and sidewall portions of the first and second recesses 160 and 180 so that the third epitaxial layer 215 may have largest maximum volume in a space defined by the second epitaxial layer 195. The third epitaxial layer 215 may have, for example, the third germanium concentration higher than the second germanium concentration of the second epitaxial layer 195. Thus, a sufficient compressive stress may be applied to the channel region, and the transistor including the channel region may have increased electrical characteristics.

Figure 10:
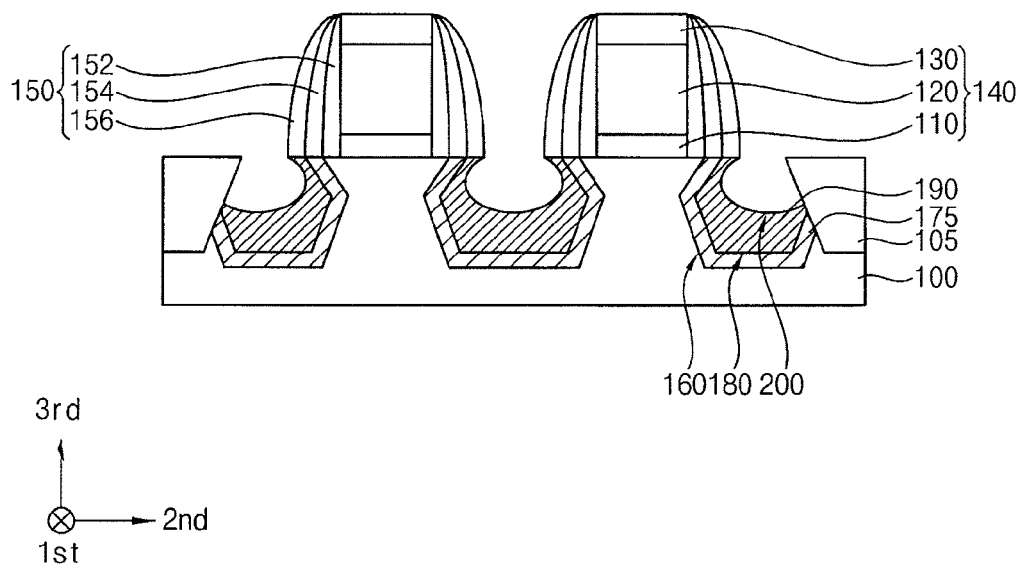
Figure 11:
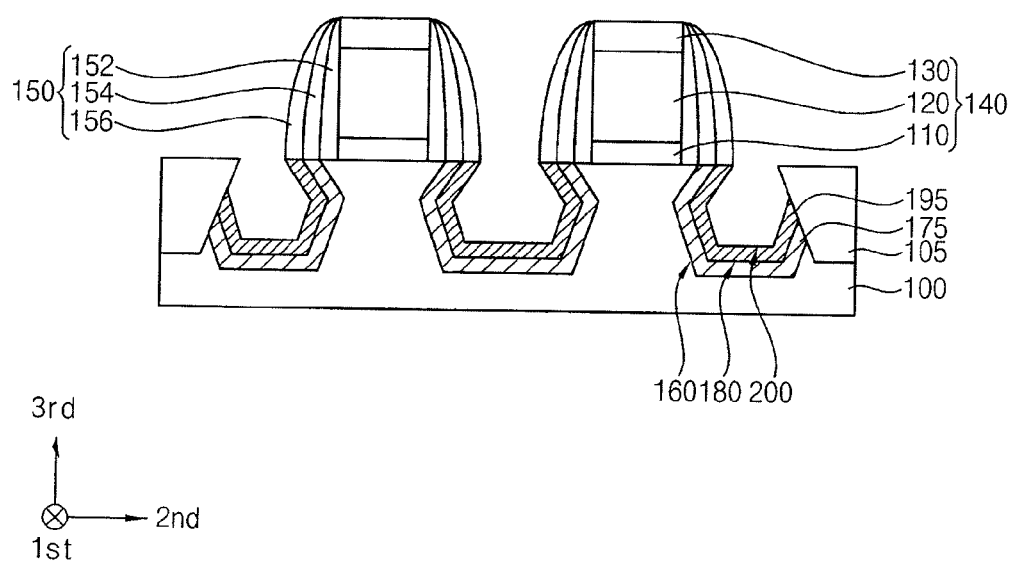

FIGS. 10 to 11 are cross-sectional views illustrating a method of manufacturing a transistor in accordance with an example embodiment. The method may be substantially the same as or similar to the method illustrated with reference to FIGS. 2 to 8, except that a third recess and a third epitaxial layer may be further formed.

Referring to FIG. 10, processes illustrated with reference to FIGS. 2 to 8 may be performed. Thus, a gate structure 140, a first spacer 152 and a second spacer 154 may be formed on a substrate 100, and a first epitaxial layer 175 and a preliminary second epitaxial layer 190 may be formed at an upper portion of the substrate 100 adjacent to the gate structure 140.

A third spacer layer may be formed on the gate structure 140, the second spacer 154 and the preliminary second epitaxial layer 190. The third spacer layer may be anisotropically etched to form a third spacer 156 covering the gate structure 140, the second spacer 154 and a portion of the preliminary second epitaxial layer 190. In an example embodiment, the third spacer 156 may be formed using, for example, silicon oxide, silicon nitride or silicon oxynitride. The first to third spacers 152, 154 and 156 may be defined as a spacer structure 150.

For example, a third dry etching process may be performed at an upper portion of the preliminary second epitaxial layer 190 adjacent to the gate structure 140 using the gate structure 140 and the spacer structure 150 as an etching mask to form a third recess 200. The third dry etching process may have, for example, isotropic etching characteristics so that the third recess 200 may be formed to have, e.g., a bullet shape. An upper portion of the third recess 200 may have, for example, a width smaller than a width of a central portion of the third recess 200. A width of the upper portion of the third recess 200 may be controlled by varying a thickness of the third spacer 156.

Referring to FIG. 11, a fourth dry etching process may be performed on the preliminary second epitaxial layer 190 adjacent to the third recess 200 to enlarge the third recess 200 and transform the preliminary second epitaxial layer 190 into a second epitaxial layer 195.

The fourth dry etching process may be performed under an atmosphere including, for example, hydrogen chloride (HCl) gas. The fourth dry etching process may be performed, for example, in the same chamber as that of a subsequent SEG process.

During the fourth dry etching process under the atmosphere including hydrogen chloride gas, the etching rate of the preliminary second epitaxial layer 190 may vary according to the crystal plane of silicon-germanium. An etching rate with respect to the (001) crystal plane of silicon-germanium may be, for example, higher than an etching rate with respect to the (111) crystal plane thereof. Thus, an etching rate in a third direction substantially perpendicular to the top surface of the substrate 100 may be relatively high. An etching rate with respect to the (111) crystal plane may be low so that the third recess 200 may have, for example, a (111) facet substantially parallel to the (111) crystal plane. The third recess 200 may have, for example, at least one (111) facet, and a bottom portion of the third recess 200 may be substantially parallel to the (001) crystal plane.

In an example embodiment, the third recess 200 may have a shape, for example, similar to that of the second recess 180. An upper sidewall of the third recess 200 may have, for example, a first (111) facet, and a lower sidewall of the third recess 200 may have, for example, a second (111) facet of which the direction of is different from that of the first (111) facet. The third recess 200 may have, for example, a width at a central portion larger than at an upper portion thereof.

The second epitaxial layer 195 may include, for example, silicon-germanium having a second germanium concentration. The second epitaxial layer 195 may have, for example, a thickness on a bottom portion of the second recess 180 similar to that on a sidewall of the second recess 180. For example, a thickness of the second epitaxial layer 195 on the bottom portion of the second recess 180 may be about 0.5 to about 1.0 times a thickness of the second epitaxial layer 195 on the sidewall of the second recess 180. In an example embodiment, the second epitaxial layer 195 may have a thickness of, for example, about 5 nm to about 20 nm on the bottom portion of the second recess 180 and a thickness of, for example, about 2.5 nm to about 20 nm on the sidewall portion of the second recess 180.

Referring to FIG. 9 again, a third epitaxial layer 215 including, for example, silicon-germanium may be formed in the third recess 200.

The third epitaxial layer 215 may be formed by, for example, an SEG process on an inner wall of the third recess 200. The SEG process may be performed using, for example, a silicon-germanium source gas by a CVD process, an LPCVD process or a UHV-CVD process.

In an example embodiment, the third epitaxial layer 215 may have, for example, a third germanium concentration of about 15 to about 80 wt %. If the germanium concentration of the third epitaxial layer 215 is less than the third germanium concentration, a compressive stress applied to a channel region may be insufficient. If the germanium concentration of the third epitaxial layer 215 is greater than the third germanium concentration, a lattice mismatch between the third epitaxial layer 215 and the second epitaxial layer 195 may occur so that a compressive stress applied to a channel region may be decreased.

In an example embodiment, the third epitaxial layer 215 may have, for example, a top surface coplanar with the top surface of the substrate 100. In an example embodiment, the third epitaxial layer 215 may alternatively have, for example, a top surface higher than the top surface of the substrate 100.

In an example embodiment, the SEG process for forming the third epitaxial layer 215 may be performed in a chamber in which the second dry etching process is performed. Thus, the processes for forming the second and third epitaxial layers 195 and 215 may be easier.

An impurity region (not shown) may be formed at an upper portion of the substrate 100 adjacent to the gate structure 140 by, for example, an ion implantation process using the gate structure 140 and the spacer structure 150 as an ion implantation mask. The impurity region may include, for example, p-type impurities such as boron, and may serve as source/drain regions of the transistor.

In an example embodiment, the impurity region may be formed at some portions of or in the entire portion of the first to third epitaxial layers 175, 195 and 215. In an example embodiment, the impurity region may be formed at upper portions of the substrate 100 together with the first to third epitaxial layers 175, 195 and 215.

Thus, the transistor may be manufactured.

According to an example embodiment, the first dry etching process and the first wet etching process may be performed on the upper portion of the substrate 100 adjacent to the gate structure 140 to form the first recess 160 having at least one (111) facet. The preliminary first epitaxial layer 170 including silicon-germanium may be formed in the first recess 160, and subsequently, the second dry etching process and the second wet etching process may be performed on the preliminary first epitaxial layer 170 to form the second recess 180 having at least one (111) facet corresponding to that of the first recess 160 and a first epitaxial layer 175 in the first recess 160. Thus, the first epitaxial layer 175 may have a uniform thickness, and the preliminary second epitaxial layer 190 including silicon-germanium may be formed on the first epitaxial layer 175. The third dry etching process and the fourth dry etching process may be performed on the preliminary second epitaxial layer 190 to form the third recess 200 having at least one (111) facet corresponding to that of the second recess 180 and a second epitaxial layer 195 in the second recess 180. Thus, the second epitaxial layer 195 may have a uniform thickness, and the third epitaxial layer 215 including silicon-germanium may be formed on the second epitaxial layer 195.

The third epitaxial layer 215 may have a maximum volume in a space provided in the upper face of the second epitaxial layer 195 and may have the third germanium concentration higher than the second germanium concentration of the second epitaxial layer 195. Thus, a sufficient compressive stress may be applied to the channel region, and the transistor including the channel region may have increased electrical characteristics.

Figure 12:
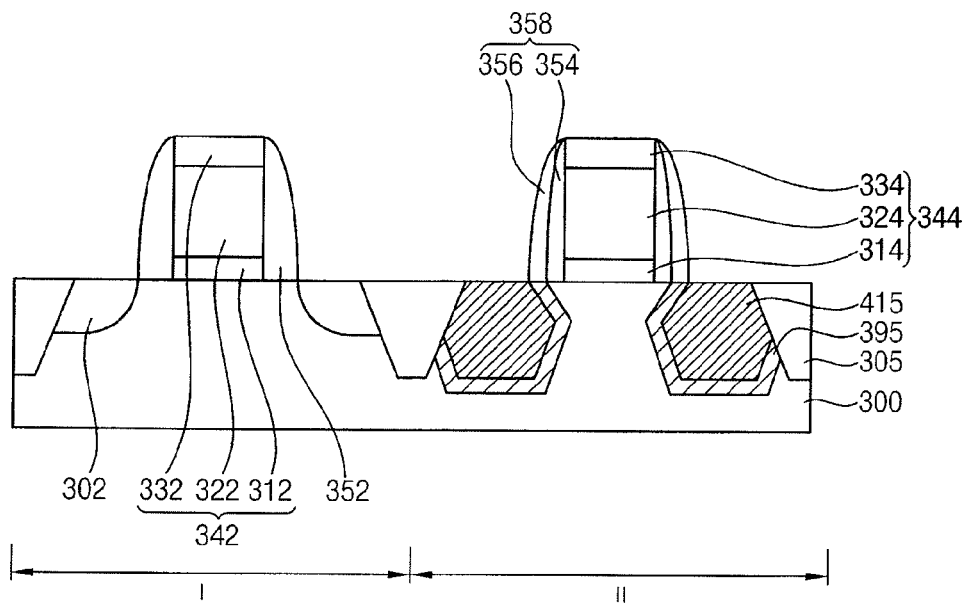

FIG. 12 is a cross-sectional view illustrating a transistor in accordance with an example embodiment. The transistor may be a CMOS transistor including the PMOS transistor illustrated with reference to FIG. 1.

Referring to FIG. 12, the transistor may include, for example, an n-channel metal oxide semiconductor (NMOS) transistor in a first region I of a substrate 300 and a p-channel metal oxide semiconductor (PMOS) transistor in a second region II of the substrate 300. In addition, an isolation layer 305 may be formed in the substrate 300 to define an active region and a field region.

The NMOS transistor may include, for example, a first gate structure 342 on the substrate 300 and a first impurity region 302 at an upper portion of the substrate 300 adjacent to the first gate structure 342.

The first gate structure 342 may include, for example, a first insulation layer pattern 312, a first gate electrode 322 and a first gate mask 332 sequentially stacked on the substrate 300. A first spacer structure may be formed on a sidewall of the first gate structure 342. In an example embodiment, the first spacer structure may include a first spacer 352.

The first impurity region 302 may include, for example, n-type impurities such as phosphorous. In an example embodiment, the first impurity region 302 may be formed, for example, in an epitaxial layer including carbon. The first impurity region 302 may serve as a first source/drain region of the transistor.

The PMOS transistor may include a second gate structure 344 on the substrate 300 and first and second epitaxial layers 395 and 415 at an upper portion of the substrate 300 adjacent to the second gate structure 344.

The second gate structure 344 may include, for example, a second insulation layer pattern 314, a second gate electrode 324 and a second gate mask 334. A second spacer structure 358 may be formed on a sidewall of the second gate structure 344, and the second spacer structure 358 may include, for example, a second spacer 354 and a third spacer 356.

The first and second epitaxial layers 395 and 415 may have, for example, at least one (111) facet on sidewalls thereof. The first and second epitaxial layers 395 and 415 may include, for example, silicon-germanium having a first germanium concentration and a second germanium concentration, respectively. The second germanium concentration may be, for example, higher than the first germanium concentration. The first and second epitaxial layers 395 and 415 may include, for example, p-type impurities such as boron, and may serve as a second source/drain region of the transistor.

According to an example embodiment, the PMOS transistor may include, for example, the first and second epitaxial layers 395 and 415, and a sufficient compressive stress may be applied to a channel region of the transistor, thereby increasing the hole mobility. The NMOS transistor may include, for example, the first impurity region 302 including carbon, and a sufficient tensile stress may be applied to a channel region of the transistor, thereby increasing the electron mobility. The CMOS transistor including the PMOS and NMOS transistors may have increased electrical characteristics.

FIGS. 13 to 19 are cross-sectional views illustrating a method of manufacturing a transistor in accordance with an example embodiment. The transistor may be a CMOS transistor including the PMOS transistor illustrated with reference to FIGS. 2 to 8.

Figure 13:
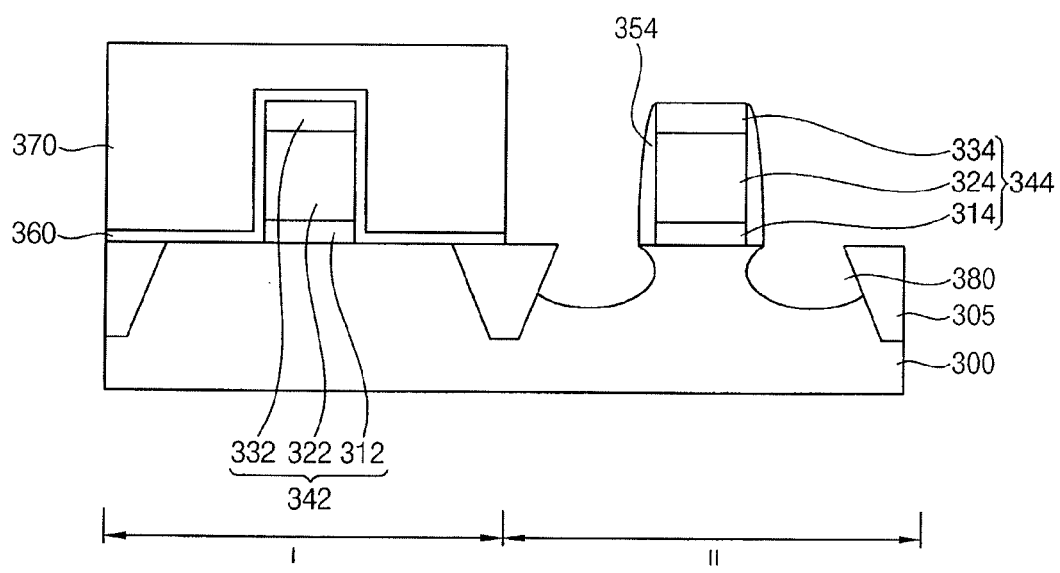

Referring to FIG. 13, a gate insulation layer, a gate conductive layer and a gate mask layer may be fanned on a substrate 300 which may be divided into a first region I and a second region II. The gate insulation layer, the gate conductive layer and the gate mask layer may be patterned to form a first gate structure 342 including, for example, a first gate insulation layer pattern 312, a first gate electrode 322 and a first gate mask 332 sequentially stacked on the substrate 300 in the first region I, and to form a second gate structure 344 including a second insulation layer pattern 314, a second gate electrode 324 and a second gate mask 334 sequentially stacked on the substrate 300 in the second region II. The first region I and the second region II may be, for example, an NMOS region and a PMOS region, respectively. An isolation layer 305 may be formed in the substrate 300. The isolation layer 305 may be formed by, for example, a shallow trench isolation (STI) process. A region of the substrate 300 in which the isolation layer 305 is not formed may be defined as an active region, and a region of the substrate 300 in which the isolation layer 305 is formed may be defined as a field region.

A first spacer layer 360 may be formed on the substrate 300 to cover the first gate structure 342 and the second gate structure 344, and a first photoresist pattern 370 may be formed on the substrate 300 in the first region I. The first spacer layer 360 may be anisotropically etched using the first photoresist pattern 370 as an etching mask to form a second spacer 354 covering a sidewall of the second gate structure 342 on the substrate 300 in the second region II. The second spacer 354 may be formed using, for example, a nitride such as silicon nitride.

A first dry etching process may be performed at an upper portion of the substrate 300 adjacent to the second gate structure 344 to form a first recess 380. The first dry etching process may have, for example, isotropic etching characteristics, so that the first recess may have, e.g., a bullet shape.

Figure 14:
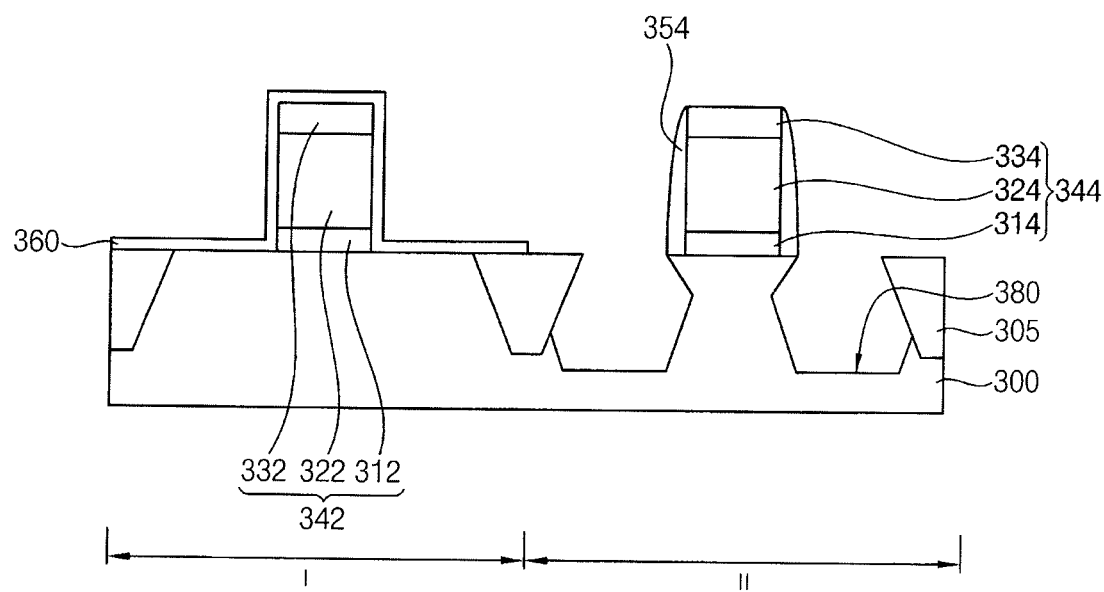

Referring to FIG. 14, a first wet etching process may be performed at a portion of the substrate 300 adjacent to the first recess 380 to enlarge the first recess 380. The first wet etching process may be performed using, for example, an etchant having an etching selectivity according to the crystal plane of silicon. An etching rate with respect to the (111) crystal plane may be low so that the first recess 380 may have, for example, at least one (111) facet substantially parallel to the (111) crystal plane, and the first recess 380 may have, for example, a bottom face substantially parallel to the (001) crystal plane.

The first photoresist pattern 370 may be removed.

Figure 15:
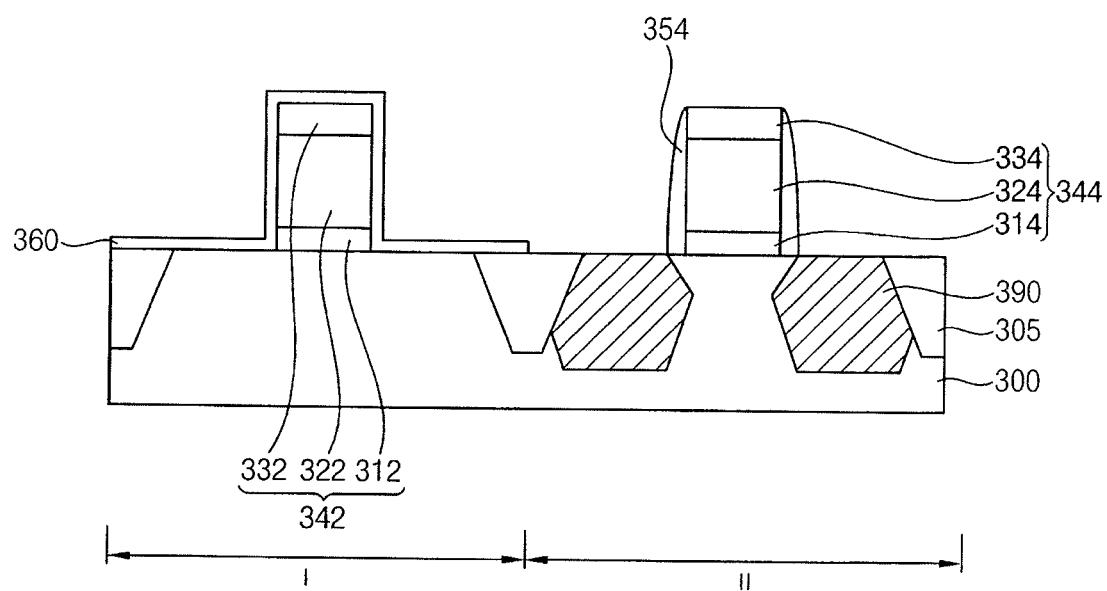

Referring to FIG. 15, a preliminary first epitaxial layer 390 including, for example, silicon-germanium may be formed in the first recess 380.

The preliminary epitaxial layer 390 may be formed by, for example, an SEG process on an inner wall of the first recess 380 using a silicon-germanium source gas. The preliminary first epitaxial layer 390 may have, for example, a first germanium concentration.

The first spacer layer 360 covering the first region I of the substrate on which the first gate structure 342 is formed may serve as a growth stop layer.

Figure 16:
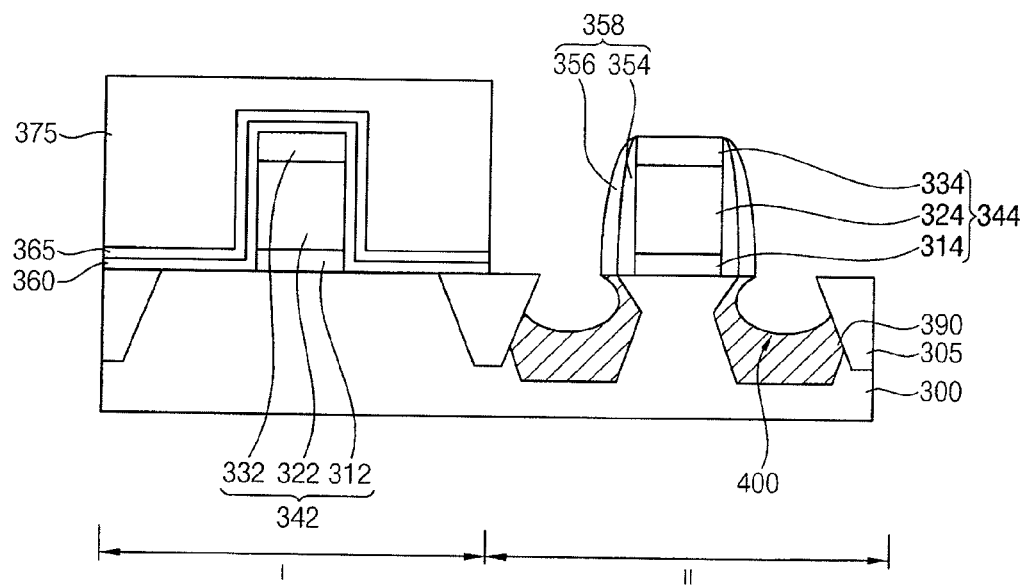

Referring to FIG. 16, a second spacer layer 365 may be formed on the first spacer layer 360 on the substrate 300 in the first region I, and on the second gate structure 344, the second spacer 354 and the preliminary first epitaxial layer 390 on the substrate 300 in the second region II. A second photoresist pattern 375 may be formed to cover the first region I. The second spacer layer 365 may be, for example, anisotropically etched using the second photoresist pattern 375 as an etching mask to form a third spacer 356 on the second spacer 354 and the preliminary first epitaxial layer 390. In an example embodiment, the third spacer 356 may be formed using, for example, silicon oxide, silicon nitride or silicon oxynitride.

For example, a second dry etching process may be performed on an upper portion of the preliminary first epitaxial layer 390 using the second gate structure 344 and the second and the third spacers 354 and 356 formed on a sidewall of the second gate structure 344 as an etching mask to form a second recess 400. The second dry etching process may have, for example, isotropic etching characteristics so that the second recess 400 may have, e.g., a bullet shape.

Figure 17:
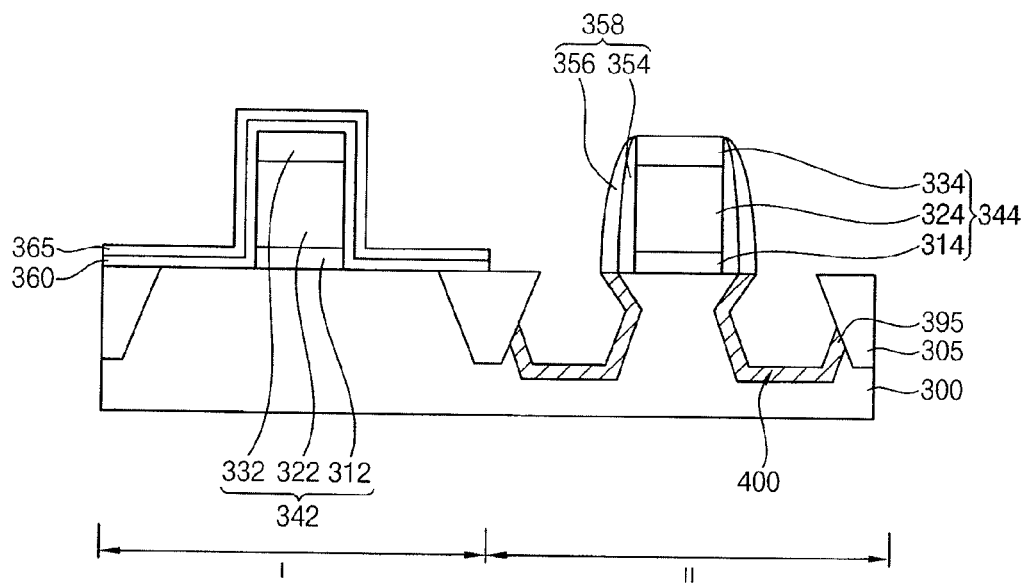

Referring to FIG. 17, a second wet etching process may be performed at an upper portion of the preliminary first epitaxial layer 390 adjacent to the second recess 400 to enlarge the second recess 400 and to transform the preliminary first epitaxial layer 390 into a first epitaxial layer 395.

In an example embodiment, the second recess 400 may be formed to have, for example, a similar shape corresponding to that of the first recess 380. The first epitaxial layer 395 may include, for example, silicon-germanium having a first germanium concentration, and a bottom portion of the first epitaxial layer 395 may have, for example, a thickness similar to that of a lateral portion thereof. In an example embodiment, the first epitaxial layer 395 may have, for example, a first germanium concentration of about 5 to about 30 wt %.

The second photoresist pattern 375 may be removed.

Figure 18:
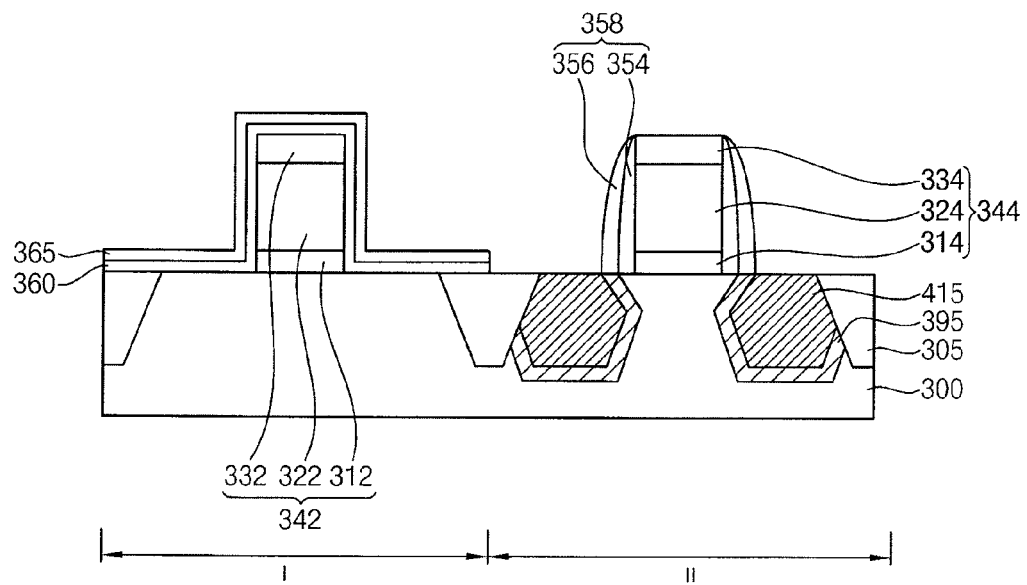

Referring to FIG. 18, a second epitaxial layer 415 including, for example, silicon-germanium may be formed in the second recess 400.

The second epitaxial layer 415 may be formed by an SEG process on an inner wall of the second recess 400. In an example embodiment, the second epitaxial layer 415 may have, for example, a second germanium concentration of about 10 to about 60 wt %.

The first and second spacer layers 360 and 365 covering the first region I of the substrate 300 on which the first gate structure 342 is formed may serve as growth stop layers.

Figure 19:
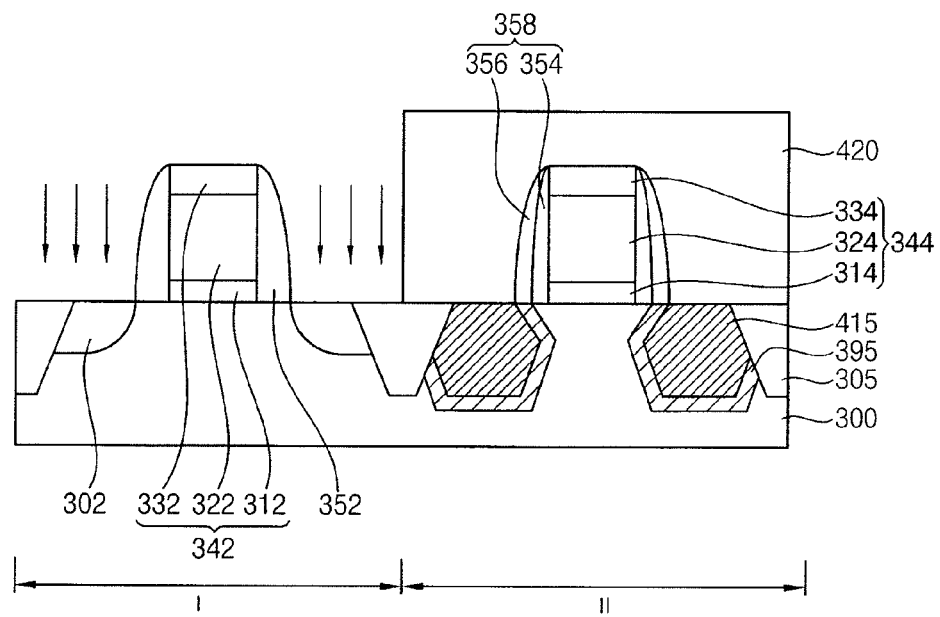

Referring to FIG. 19, a third photoresist pattern 420 may be formed on the second gate structure 344 and the second region II of the substrate 300 on which the second gate structure 344 is formed. The first and second spacer layers 360 and 365 may be, for example, anisotropically etched using the third photoresist pattern 420 as an etching mask to form a first spacer 352 on a sidewall of the first gate structure 342 on the substrate 300 in the first region I.

Impurities may be implanted by, for example, an ion implantation process at an upper portion of the substrate 300 in the first region I using the first gate structure 342 and the first spacer 352 as an ion implantation mask to form a first impurity region 302. The impurities may be, for example, n-type impurities such as phosphorous or arsenic. In an example embodiment, the first impurity region 302 may be formed to have a depth of, for example, about 100 to about 1000 Å.

For example, in an example embodiment, carbon ions may be further implanted into an upper portion of the substrate 300 adjacent to the first gate structure 342 to form the first impurity region 302 including silicon carbide (SiC). In this case, an annealing process may be further performed. The first impurity region 302 may include, for example, carbon together with n-type impurities so that a tensile stress may be applied to a channel region between the first impurity regions 302, thereby increasing the electron mobility of the channel region.

The third photoresist pattern 420 may be removed.

A fourth photoresist pattern (not shown) may be formed to cover the first region I in which the first gate structure 342 and the first spacer 352 are formed. Impurities may be, for example, implanted into an upper portion of the substrate 300 adjacent to the second gate structure 344 using the second gate structure 344 and the second spacer structure 358 as an ion implantation mask to form a second impurity region (not shown). The impurities may include, for example, p-type impurities such as boron.

Alternatively, the second impurity region may be formed using, for example, a source gas including the impurities during the process for forming the preliminary first epitaxial layer 390 and/or the second epitaxial layer 415.

Thus, the transistor may be manufactured.

According to an example embodiment, the PMOS transistor may include the first and second epitaxial layers 395 and 415 so that a sufficient compressive stress may be applied to the channel region, thereby increasing the hole mobility of the channel region. The NMOS transistor may include the first impurity region 302 including carbon so that a sufficient tensile stress may be applied to the channel region, thereby increasing the electron mobility of the channel region. Thus, the CMOS transistor having the PMOS and NMOS transistors may have good electrical characteristics.

Figure 20:
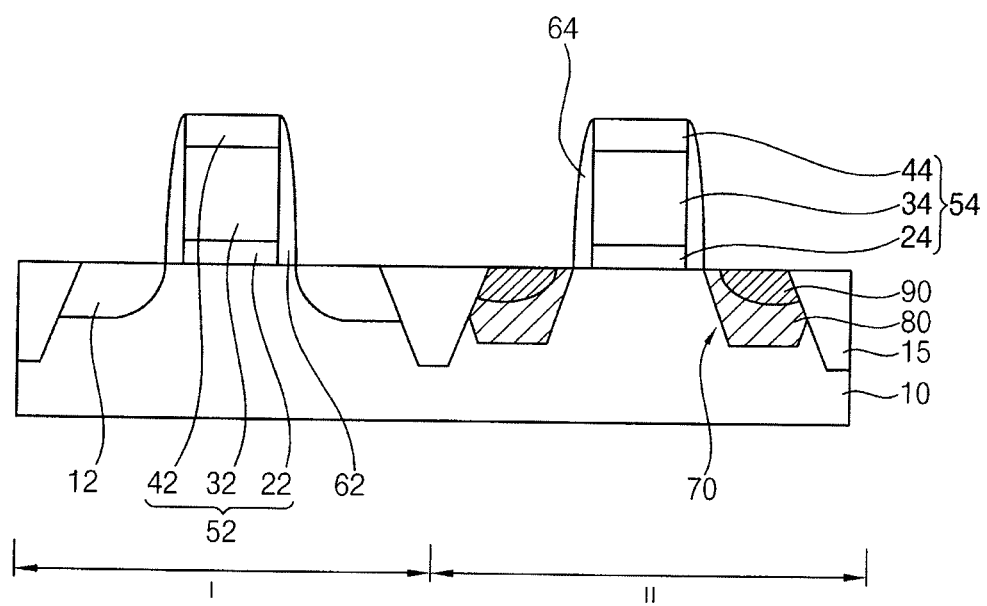

FIG. 20 is a cross-sectional view illustrating a method of manufacturing a transistor in accordance with a comparative embodiment.

Referring to FIG. 20, a first gate structure 52 and a second gate structure 54 may be formed on a substrate 10 in a first region I and a second region II, respectively. The first gate structure 52 may include a first insulation layer pattern 22, a first gate electrode 32 and a first gate mask 42, and the second gate structure 54 may include a second gate insulation layer pattern 24, a second gate electrode 34 and a second gate mask 44.

A first spacer 62 may be further formed on a sidewall of the first gate structure 52, and n-type impurities may be implanted into an upper portion of the substrate 10 adjacent to the first gate structure 52 using the first gate structure 52 and the first spacer 62 as an ion implantation mask to form a first impurity region 12. The first gate structure 52 and the first impurity region 12 on the substrate 10 in the first region I may serve as an NMOS transistor.

A second spacer 64 may be further formed on a sidewall of the second gate structure 54, and an upper portion of the substrate 10 adjacent to the second gate structure 54 may be etched to form a recess 70. In this case, a dry etching process having isotropic etching characteristics may be performed, or a wet etching process having anisotropic etching characteristics may be performed. Also, a wet etching process may be performed using an etchant having an etching selectivity according to the crystal plane of silicon so that a sidewall of the recess 70 may have at least one (111) facet substantially parallel to the (111) crystal plane of silicon, and a bottom face of the recess 70 may be substantially parallel to the (001) crystal plane.

An SEG process may be performed on an inner wall of the recess 70 to form a first epitaxial layer 80 partially filling the recess 70. The first epitaxial layer 80 may be formed to include silicon germanium having a first germanium concentration using a silicon-germanium source gas by a CVD process, an LPCVD process or a UHV-CVD process.

A growth rate with respect to the (001) crystal plane may be higher than that with respect to the (111) crystal plane because the (001) crystal plane of silicon may have a packing density lower than that of the (111) crystal plane of silicon. Thus, the first epitaxial layer 80 on the bottom portion of the recess 70 substantially parallel to the (001) crystal plane may have a thickness larger than that of the first epitaxial layer 80 on the sidewall of the recess 70 substantially parallel to the (111) crystal plane.

A second epitaxial layer 90 may be formed on the first epitaxial layer 80 by an SEG process. The second epitaxial layer 90 may include silicon-germanium having a second germanium concentration. In present comparative embodiment, the second germanium concentration may be higher than the first concentration of the first epitaxial layer 80.

The first epitaxial layer 80 may have a thickness larger than a minimum thickness so that a lattice mismatch or a slip dislocation generated between the substrate 10 including silicon and the second epitaxial layer 90 may be prevented. A thickness of the first epitaxial layer 80 on the bottom portion of the recess 70 is different from a thickness of the first epitaxial layer 80 on the sidewall portion of the recess 70, such that the second epitaxial layer 90 may have a reduced volume in a space defined by an upper face of the first epitaxial layer 80. Thus, a sufficient compressive may not be applied to a channel region of the transistor.

Having described example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a transistor, comprising:
forming a gate structure on a substrate including silicon;
etching an upper portion of the substrate adjacent to the gate structure to form a first recess in the substrate;
forming a preliminary first epitaxial layer including silicon-germanium in the first recess;
etching an upper portion of the preliminary first epitaxial layer to form a second recess on the preliminary first epitaxial layer;
etching a portion of the preliminary first epitaxial layer adjacent to the second recess to thereby enlarge the second recess and transform the preliminary first epitaxial layer into a first epitaxial layer; and
forming a second epitaxial layer including silicon-germanium in the second recess located on the first epitaxial layer.

2. The method of claim 1, wherein both of the first and second recesses include at least one facet substantially parallel to the (111) crystal plane of silicon.

3. The method of claim 1, wherein the second epitaxial layer has a germanium concentration higher than that a germanium concentration of the first epitaxial layer.

4. The method of claim 1, wherein the forming of the first recess includes:
forming a first spacer on a sidewall of the gate structure;
performing a first dry etching process at an upper portion of the substrate adjacent to the gate structure using the gate structure and the first spacer as an etching mask to form the first recess; and
performing a first wet etching process at an upper portion of the substrate adjacent to the first recess to enlarge the first recess.

5. The method of claim 4, wherein the first dry etching process has isotropic etching characteristics.

6. The method of claim 4, wherein the first wet etching process is performed using an etchant having an etching selectivity according to the crystal plane of silicon.

7. The method of claim 6, wherein the etchant includes any one selected from the group consisting of ammonium hydroxide ($NH_4OH$), tetramethyl ammonium hydroxide (TMAH), potassium hydroxide (KOH), sodium hydroxide (NaOH) and benzyltrimethylammonium hydroxide (BTMH).

8. The method of claim 4, wherein the forming of the second recess includes:
forming a second spacer on the first spacer;
performing a second dry etching process at the upper portion of the preliminary first epitaxial layer adjacent to the gate structure using the gate structure and the first and second spacers as an etching mask to form the second recess; and
performing a second wet etching process at the portion of the preliminary first epitaxial layer adjacent to the second recess to enlarge the second recess and transform the preliminary first epitaxial layer into the first epitaxial layer.

9. The method of claim 8, wherein the second dry etching process has isotropic etching characteristics, and wherein the second wet etching process is performed using an etchant having an etching selectivity according to the crystal plane of silicon.

10. The method of claim 1, further comprising:
etching an upper portion of the second epitaxial layer to form a third recess in the second epitaxial layer; and
forming a third epitaxial layer including silicon-germanium in the third recess,
wherein the third epitaxial layer has a germanium concentration higher than a germanium concentration of each of the first and second epitaxial layers.

11. The method of claim 10, wherein the forming of the third recess includes:
forming a third spacer on a sidewall of the gate structure;
performing a third dry etching process at an upper portion of the second epitaxial layer adjacent to the gate structure to form the third recess; and
performing a fourth dry etching process at a portion of the second epitaxial layer adjacent to the third recess to enlarge the third recess.

12. The method of claim 11, wherein the third dry etching process has isotropic etching characteristics, and wherein the fourth dry etching process is performed under an atmosphere including hydrogen chloride (HCl) gas.

13. The method of claim 1, wherein the first epitaxial layer has a substantially uniform thickness on a bottom portion and sidewall portions of the first recess.

14. A transistor comprising:
  a gate structure on a silicon substrate having a first recess formed therein, wherein the gate structure is adjacent to the first recess;
  a first epitaxial layer on an inner wall of the first recess, wherein the first epitaxial layer includes silicon-germanium and the first recess includes at least one (111) facet substantially parallel to the (111) crystal plane, wherein the first epitaxial layer includes a second recess formed thereon; and
  a second epitaxial layer formed in the second recess located on the first epitaxial layer, wherein the second epitaxial layer includes silicon-germanium and the second recess includes at least one (111) facet substantially parallel to the (111) crystal plane.

15. The transistor of claim 14, wherein the second epitaxial layer has a germanium concentration higher than a germanium concentration of the first epitaxial layer.

16. The transistor of claim 15, wherein the first epitaxial layer has a germanium concentration of about 5 to about 30 wt %, and the second epitaxial layer has a germanium concentration of about 10 to about 60 wt %.

17. A method for manufacturing a complementary metal oxide semiconductor (CMOS) comprising:
  forming a gate insulation layer, a gate conductive layer and a gate mask layer on a substrate composed of silicon and including an NMOS region and a PMOS region;
  patterning the gate insulation layer, the gate conductive layer and the gate mask layer to form a first gate structure including, a first gate insulation layer pattern, a first gate electrode and a first gate mask sequentially stacked on the substrate in the NMOS region, and a second gate structure including a second insulation layer pattern, a second gate electrode and a second gate mask sequentially stacked on the substrate in the PMOS region;
  forming a first spacer layer on the substrate to cover the first gate structure and the second gate structure;
  etching the first spacer layer to form a first spacer covering a sidewall of the second gate structure on the substrate in the PMOS region;
  performing a first dry etching process at an upper portion of the substrate adjacent to the second gate structure to form a first recess in the substrate in the PMOS region;
  performing a first wet etching process at a portion of the substrate adjacent to the first recess to enlarge the first recess;
  forming a preliminary first epitaxial layer including silicon-germanium in the first recess;
  forming a second spacer layer on the first spacer layer in the NMOS region and on the second gate structure and the preliminary first epitaxial layer on the substrate in PMOS region;
  etching the second spacer layer to form a second spacer on the first spacer and the preliminary first epitaxial layer;
  performing a second dry etching process on an upper portion of the preliminary first epitaxial layer using the second gate structure and the first and second spacers formed on a sidewall of the second gate structure as an etching mask to form a second recess on the preliminary first epitaxial layer;
  performing a second wet etching process at an upper portion of the preliminary first epitaxial layer adjacent to the second recess to enlarge the second recess and to transform the preliminary first epitaxial layer into a first epitaxial layer, wherein the first epitaxial layer has a substantially uniform thickness on a bottom portion and sidewall portions of the first recess, and wherein a germanium concentration of the second epitxial layer is greater than a germanium concentration of the first epitaxial layer;
  forming a second epitaxial layer including silicon-germanium in the second recess located on the first epitaxial layer;
  etching the first and second spacer layers in the NMOS region to form a third spacer on a sidewall of the first gate structure on the substrate in the NMOS region; and
  implanting impurities at a portion of substrate in the NMOS region to form a first impurity region therein and at a portion of the substrate in the PMOS region to form a second impurity region therein.

18. The method of claim 17, wherein the forming of the first and second impurity regions comprises:
  implanting n-type impurities at an upper portion of the substrate adjacent to the first gate structure in the NMOS region using the first gate structure and the third spacer as an ion implantation mask;
  implanting carbon ions into the upper portion of the substrate adjacent to the first gate structure in the NMOS region to form the first impurity region including silicon carbide (SiC) together with the n-type impurities; and
  implanting p-type impurities at an upper portion of the substrate adjacent to the second gate structure in the PMOS region using the second gate structure and the first and second spacers as an ion implantation mask.

19. The method of claim 17, wherein the first recess is formed to have a width which is larger at a central portion thereof than a width at an upper portion thereof and the second recess is formed to have a width which is larger at a central portion thereof than a width at an upper portion thereof, and wherein the first epitaxial layer has a germanium concentration of about 5 to about 30 wt %, and the second epitaxial layer has a germanium concentration of about 10 to about 60 wt %.

20. The method of claim 17, wherein an upper sidewall of the first recess has a first (111) facet and a lower sidewall of the first recess has a second (111) facet of which is in a direction different from a direction of the first (111) facet of the first recess and wherein an upper sidewall of the second recess has a first (111) facet and a lower sidewall of the second recess has a second (111) facet of which is in a direction different from a direction of the first (111) facet of the second recess.

* * * * *